United States Patent [19]

Krienin

[11] Patent Number: 4,939,493

[45] Date of Patent: Jul. 3, 1990

[54] MAGNETIC FIELD GENERATOR

[75] Inventor: Frank Krienin, Shoreham, N.Y.

[73] Assignee: Boston University, Boston, Mass.

[21] Appl. No.: 249,666

[22] Filed: Sep. 27, 1988

[51] Int. Cl.$^5$ .............................................. H01F 7/00
[52] U.S. Cl. .................................. 335/210; 335/299;
  335/216; 313/421
[58] Field of Search ............... 335/210, 216, 299, 301;
  313/421, 426

[56] References Cited

U.S. PATENT DOCUMENTS

| | | | |
|---|---|---|---|
| 4,680,565 | 7/1987 | Jahnke | 335/299 |
| 4,737,727 | 4/1988 | Yamada et al. | 335/216 X |
| 4,769,623 | 9/1988 | Marsing et al. | 335/299 X |
| 4,814,731 | 3/1989 | Sato et al. | 335/216 |

OTHER PUBLICATIONS

Bailey et al., "Final Report on the Cern Muon Storage Ring . . . Time Dilation," *Nuclear Physics* B150 (1979), pp. 1–75.

Nolden et al., "Superconducting Channel Magnets Without Stray Fields," *Journal De Physique*, Tome 45, pp. C1-221-C1-224 (1984).

Lebee, Gerald, "Measurement of the Stray Field of Inflector;2, Nov. 1976".

*Primary Examiner*—George Harris
*Attorney, Agent, or Firm*—Hamilton, Brook, Smith & Reynolds

[57] ABSTRACT

A magnetic field generating device provides a useful magnetic field within a specific region, while keeping nearby surrounding regions virtually field free. By placing an appropriate current density along a flux line of the source, the stray field effects of the generator may be contained. One current carrying structure may support a truncated cosine distribution, and it may be surrounded by a current structure which follows a flux line that would occur in a full coaxial double cosine distribution. Strong magnetic fields may be generated and contained using superconducting cables to approximate required current surfaces.

26 Claims, 7 Drawing Sheets

MAGNETIC FIELD GENERATOR

GOVERNMENT SUPPORT

The U.S. government has rights to this invention under DOE contract DE-AC02-86ER40284.

BACKGROUND OF THE INVENTION

A magnetic field generating device with low stray fields finds application in the design of a magnetic channel. A useful magnetic channel has a predetermined magnetic field generated in the channel by current sheets or current wires surrounding the channel. Such a channel is often used for the transport of particle beams. It is usually required that the channel have low stray fields so as not to disturb adjacent particle beams or instruments which are sensitive to magnetic fields.

One approach to the design involves a current structure creating a desired magnetic field in a specified area and having the concomitant stray field annihilated at larger radii by a system of coaxial currents completely surrounding said specified area.

Another approach to the design involves a septum magnet with a massive inner conducting core and an outer conducting shell. The shapes of the core and the shell may be selected in an iterative process using a computer algorithm which ensures zero stray field. Successive modifications of the shape may lead to satisfactory field in the channel. Then, the surface current is discretized in physically realizable current wires, introducing at the same time a small stray field. In order to generate the necessarily strong fields and to avoid the presence of any ferromagnetic material, superconducting current carriers have been suggested.

SUMMARY OF THE INVENTION

In one implementation of the present invention a magnetic field generating device includes a first axial current conducting structure which supports a current density approximating a cosine distribution about a truncated cylinder. A second axial current conducting structure supports a current in an axial direction opposite to the direction of the current carried by the first structure. The second structure supports a current density which causes a near zero field due to the first and second conductors to the side of the second conductor away from the first conductor. The current conducting structures can be approximated by a distribution of discrete conductors which may or may not be of a superconducting nature. In a another implementation, the second structure is shaped to approximate a closed flux surface of constant magnetic potential formed by one or more fully cylindrical concentric conductors, each supporting a cosine distribution of current. In preferred devices, the second structure surrounds the first and a near zero field is caused everywhere outside the second structure.

One form of the present invention finds application in the local cancellation of a magnetic field generated for a particle storage ring, thus allowing the injection of charged particles into the storage ring. The first and second axial current conducting structures generate a combined magnetic field equal in magnitude and opposite in polarity to the field generated for the storage ring. The field is generated in the region of the channel device under the influence of the field generated for the storage ring.

The present invention includes a method of manufacturing a magnetic field generating device which creates a magnetic field in a first region within a first boundary, and a near zero stray magnetic field in a region outside a second boundary. The method involves first determining a possible source of the predetermined field within the first boundary. A flux surface of constant magnetic potential created by the source is then found between the first boundary and the second boundary. Finally, a current density is found along the flux surface which, with the portion of the source located on the side of the flux surface opposite to the second region, results in zero stray magnetic field on the side of the flux surface on which the second surface is located. A field generating device is then constructed which includes the desired portion of the source and a structure supporting the determined current density.

The device constructed by the aforementioned method can be manufactured as separate structures to be fitted together, each separate structure supporting a different portion of the current density. When manufactured in this manner, the device may be held together by a mechanical securing means or by other fastening methods.

PREFERRED EMBODIMENT OF THE INVENTION

Figure 1:
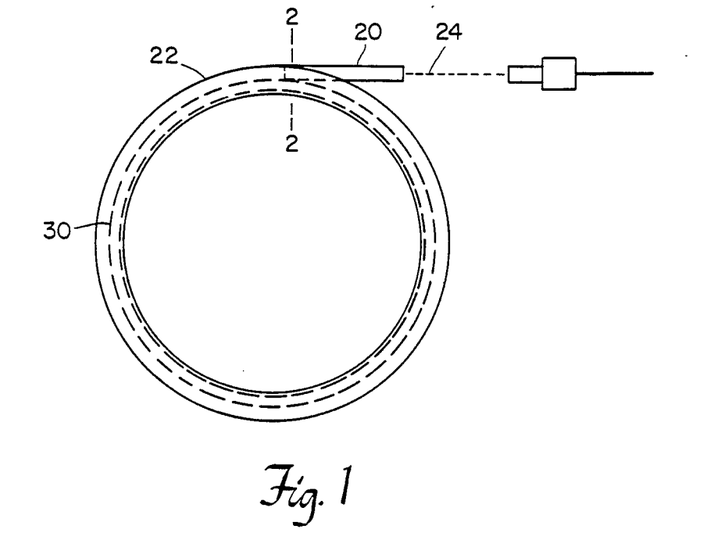
FIG. 1 is a side view of a muon storage ring with inflector and an entering particle beam.
Figure 2:
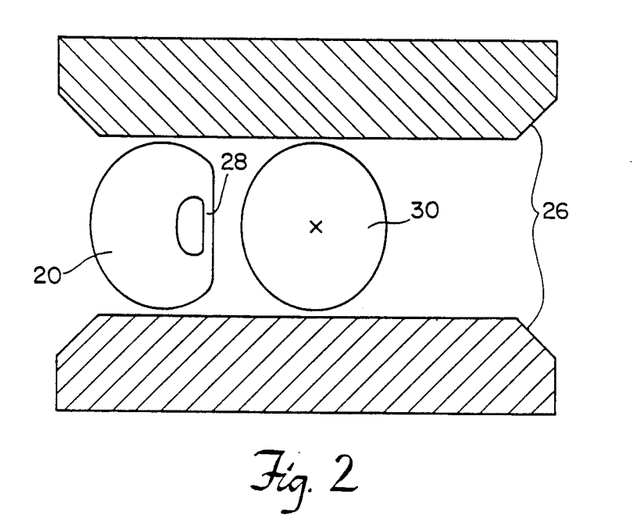
FIG. 2 is a cross section of FIG. 1 at the point near where the inflector meets the storage ring.

FIG. 1 shows a channel magnet inflector 20 as it attaches to a muon storage ring 22. A beam of particles 24 is guided through the channel and tangentially enters an orbit within the ring. The cross section taken by line 2—2 near the junction is shown in FIG. 2. The constant dipole magnetic field generated through the inflector channel 28 by the storage ring magnet 26 must be neutralized all along the path followed by the incoming particle beam up to the junction of the inflector channel 28 and the storage ring chamber 30. Therefore, the field generated by the inflector 31 which passes through the inflector channel 28, must be equal and opposite to the field generated by the storage ring magnet 26 that passes through the inflector channel 28 to provide the field free region up to the point of particle entry. On the other hand, stray fields from the inflector 20 in the channel 30 must be minimized.

Figure 3A:
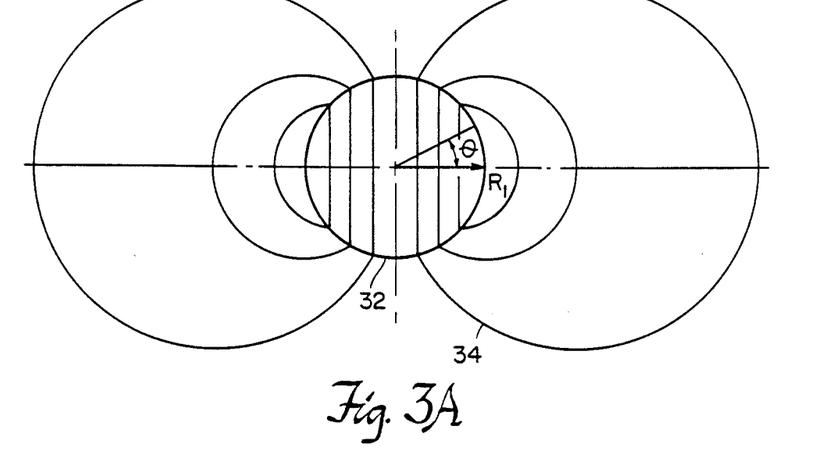
FIG. 3A shows a cylindrical dipole cosine distribution of current and resulting magnetic field flux lines.

One known source of a pure dipole field is a cylindrical distribution of axial current, where the current density on the cylinder follows a cosine distribution around the cylinder. A single cylindrical current sheet 32 of this type is shown in FIG. 3A, along with some typical lines of magnetic flux. The cylinder has radius R1 and carries the current density distribution:

$$K_1 = \hat{K}_1 \cos N\theta \qquad (1)$$

where angle $\theta$ is referenced to the horizontal axis. For $N=1$, the magnetic flux density, $B_{R1}$, is uniform in the y-direction within the cylindrical region of radius $r>R_1$, providing a dipole region of flux density:

$$B_{R1} = \tfrac{1}{2}\mu_0 \hat{K}_1 \qquad (2)$$

where $\mu_0$ is the vacuum permeability. Quadrupoles and other harmonic fields can be generated by increasing the integer N in the current density equation.

Figure 3B:
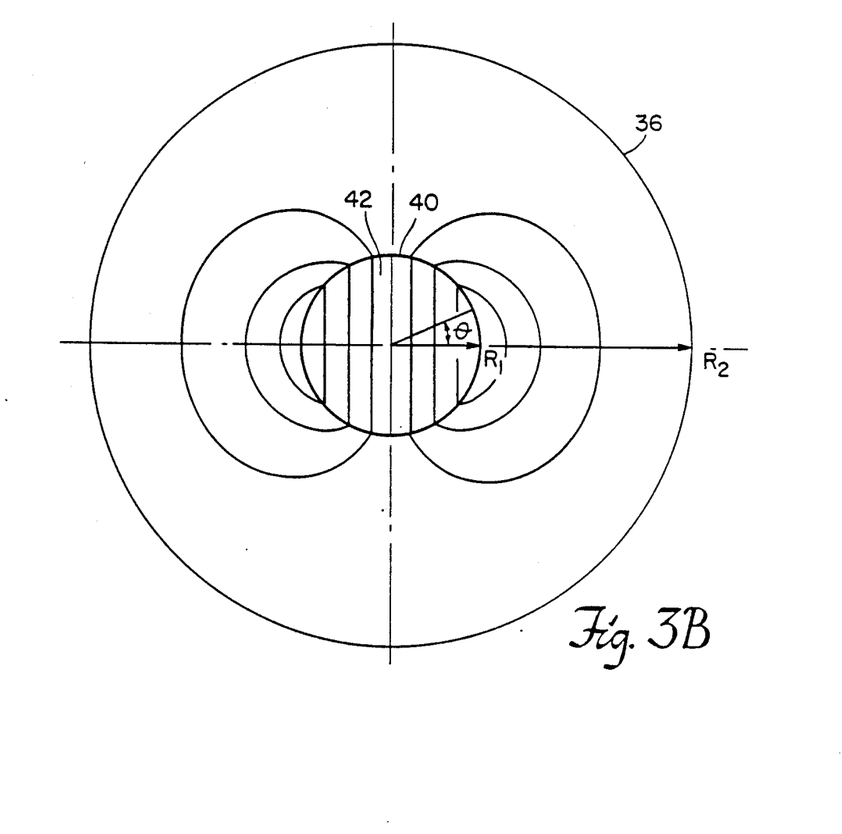
FIG. 3B is a double cosine current distribution and resulting flux lines.

To provide a field free region, a second cylindrical cosine distribution of radius $R_2$ 36 is added which carries the current density distribution:

$$K_2 = \hat{K}_2 \cos N\theta \qquad (3)$$

This is shown in FIG. 3B. If $K_2$ is made such that:

$$\hat{K}_1 R_1^{(N+1)} = -\hat{K}_2 R_2^{(N+1)}$$

so that for $N=1$, $$\hat{K}_1 R_1^2 = -\hat{K}_2 R_2^2 \qquad (4)$$

the region outside radius $R_2$ is made field free by the combined field effects of the two current distributions 36, 40. Since for $N=1$, both distributions generate fields within the radius $R_1$ which are uniform in the y-direction, the field within $R_1$ remains a pure dipole.

The double cosine configuration provides a pure predetermined field within a chosen region 42, and zero stray fields outside a distinct boundary 36. The problem with the double cosine method is that with the current densities that are practicably achievable on the current surfaces 36,40, the distance necessary between $R_1$ and $R_2$ is unacceptable for getting the inflector channel close enough to the storage ring for particle injection.

Figure 4A:
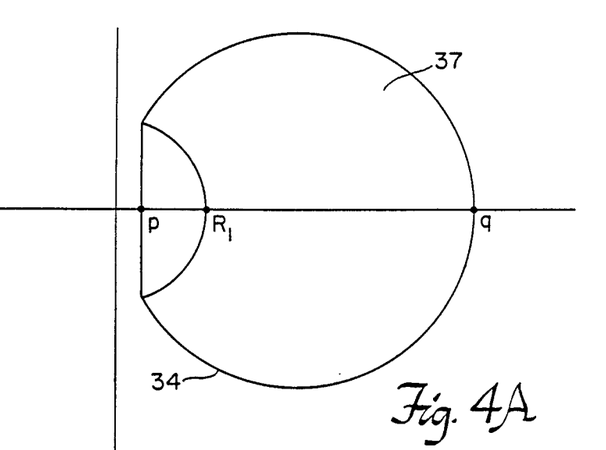
FIG. 4A shows a cylindrical cosine distribution truncated at a chosen flux line.

As will be discussed below, by placing a conductor surface along a chosen line of flux, the cylindrical distribution at radius $R_1$ may be truncated along that line of flux, and a current density on the surface which creates a zero external field without changing the internal field may be determined. FIG. 4A is modification of FIG. 3A where a chosen flux line 34 is the location of a new current surface Portions of the cosine distribution not enclosed by this flux line no longer exist.

For zero magnetic field outside a flux line 34, standard boundary conditions prescribe the value of the current density K on the chosen flux line 34 according to:

$$n \times B_{INT} = -\mu_0 K \qquad (5)$$

where n is the outward unit vector normal to the boundary $B_{INT}$ is the magnetic field vector on the inside of the boundary, and K is the surface current density vector.

Finding $B_{INT}$ from known single or double cosine distributions allows a value of K to be chosen such that $B_{EXT}$ goes to zero. Putting the current density K on the chosen flux line 34 creates a zero flux region outside the chosen flux line without modifying the internal field. FIG. 4A shows how a pure dipole field now exists adjacent to a field free region. This allows for the desired field in the inflector to be close enough to the storage ring to allow the injection of charged particles without disturbing the field within the storage ring.

For a single cosine distribution one may write:

$$B_{int} = \tfrac{1}{2}\mu_0 \hat{K}_1 R_1^2/r^2 \quad R_1 < r \qquad (6)$$

where in polar coordinates, r is the distance from a point on the boundary to the origin.

Figure 4B:
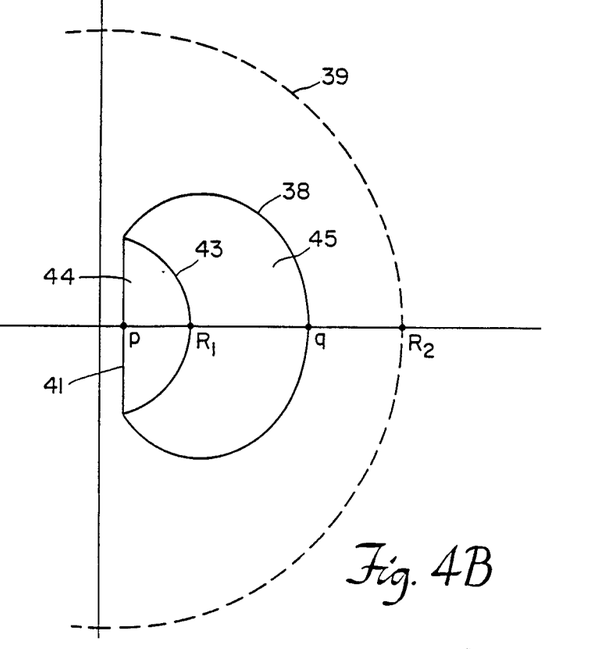
FIG. 4B shows a truncated double cosine distribution with a current surface following a chosen flux line.

The dead space 37 of FIG. 4A can be reduced in size by utilizing the compression effect of the double cosine configuration. FIG. 4B shows the double cosine configuration with one line of flux 38. The presence of the outer cosine distribution 39 causes the flux lines to be squeezed in closer to the inner surface 43. The magnetic potential for the chosen flux surface 38 can be found by a method similar to that used to find the magnetic potential of a flux line of a single cosine distribution. By using the flux density contributions of both cosine distributions 39,43 to find $B_{INT}$, a current density can be placed on the compressed flux line 38 which makes the outer surface 39 virtual. The dead space 45 is greatly reduced relative to the truncated single cosine distribution of FIG. 4A, which improved over the full double cosine distribution. All of the area outside the flux line surface 38 is virtually field free. Any line of flux may be chosen for this technique, but the smaller the enclosed area is, the more current density will be needed to create the field free region The size of the useful dipole region 44 will also depend on which flux path is chosen.

A more detailed development of the truncated double cosine theta theory starts by recognizing that current density K does not depend on the axial coordinate of the dipole field. Since the field is two dimensional, one can introduce profitably complex potentials which depend on the variable $z = x + iy$. For instance, the vector potential A has a single component $A(x,y)$ pointing in axial direction, and for $N=1$ we would have:

$$A_{int} = -(\mu_0 \hat{K} R/2)(x/R) = -(\mu_0 \hat{K} R/2)\mathrm{Re}(z/R)$$
$$|z| < R$$

$$A_{ext} = -(\mu_0 \hat{K} R/2)/x^2 + y^2) = -(\mu_0 \hat{K} R/2)\mathrm{Re}(R/z)$$
$$|z| > R$$

In this system, the complex potential would be:

$$\zeta_{int} = A_{int} - iF_{int} = -(\mu_0 \hat{K} R/2)(z/R) \quad |z| < R \qquad (7a)$$

$$\zeta_{ext} = A_{ext} - iF_{ext} = -(\mu_0 \hat{K} R/2)(R/z) \quad |z| > R \qquad (7b)$$

Magnetic flux lines follow lines of constant A, which close upon themselves, whereas lines of constant F which are orthogonal to those of A, provide the direction of the force on axial current elements. Lines of constant F are discontinuous on current boundaries in magnitude and direction and are most useful to lump in optimal fashion a distribution of surface currents into a distribution of line currents, making the device physically realizable.

The truncation is invariably along a line of constant A. On this line can be constructed a surface distribution of current, which nullifies the field on the outside but leaves unaltered the field on the inside. The boundary condition of Equation 5 can be applied:

$$n \times B_{int} = -\mu_o K_t \quad (5)$$

where $K_t$ is the surface current density on the truncation.

FIG. 4B shows the principle for a dipole septum. The cosine theta distribution is now limited to the circle segment 43. The truncation consists of a straight line segment 41, the septum, on which the current density is uniform. The septum boundary is closed by the segment 38, on which the surface current density equals $|B|/\mu_o$. The useful dipole field is contained in the area between 41 and 43 the dead space is between 43 and 38 and the area outside 41 and 38 is field free. The total current in 43 is opposite and equal to the sum of the currents in 41 and 38.

A magnetic field produced by two concentric cosine theta distributions, $(\hat{K}_1, R_1)$ and $(\hat{K}_2, R_2)$, creates three regions where the potential differs:

$$\zeta_1 = -(\mu_o \hat{K}_1 R_1/2)(z/R_1) - (\mu_o \hat{K}_2 R_2/2)(z/R_2)$$
$$|z| < R_1 \quad (8a)$$

$$\zeta_2 = -(\mu_o \hat{K}_1 R_1/2)(R_1/z) - (\mu_o \hat{K}_2 R_2/2)(z/R_2)$$
$$R_1 < |z| < R_2 \quad (8b)$$

$$\zeta_3 = -(\mu_o \hat{K}_1 R_1/2)(R_1/z) - (\mu_o \hat{K}_2 R_2/2)(R_2/z)$$
$$|z| > R_2 \quad (8c)$$

We note that under circumstances $\zeta_1$ may be made zero, creating a field free region inside $R_1$. Likewise, one can find the condition for which $\zeta_3$ is zero, creating a field free region outside $R_2$. Useful as this may be for certain applications, the objective here is to reduce the overall width of the device. In the case of FIG. 4A, we have the relation $pq - R_1^2 = 0$, in which p is the distance from origin to septum, measured on the x-axis, and q is the distance from origin to boundary 34, also measured on the x-axis. Clearly, q can be quite large, dependent on the aspect ratio of the useful dipole region. But the double cosine theta distribution allows one to squeeze the return flux at will, albeit at the expense of more ampere turns for the same useful dipole strength. In FIG. 4B, a second virtual cosine theta distribution $K_2 = \hat{K}_2 \cos \theta$ is applied on circle 39 with radius $R_2 > R_1$. The dipole area has the boundaries 41 and 43 and the area outside 41 and 38 is field free. The generating currents on 39 are virtual, since they are not physically present in the device. However 38 is uniquely determined by specifying $\hat{K}_2$ in addition to $\hat{K}_1$, $R_1$, and p.

Since boundary 38 follows a line of constant A, its value equals the potential on the septum 41 or:

$$A_{38} = A_{41} = \text{Re}(\zeta_1)_{x=p} = -\tfrac{1}{2}\mu_o p(\hat{K}_1 + \hat{K}_2).$$

Similarly one has, $$A_{38} = \text{Re}(\zeta_2) = -(\tfrac{1}{2}\mu_o \hat{K}_1 R_1^2)x/(x^2+y^2) - (\tfrac{1}{2}\mu_o \hat{K}_2)x$$

so the equation of 38 is, $$\hat{K}_1 R_1^2 x/(x^2+y^2) + \hat{K}_2 x = (\hat{K}_1 + \hat{K}_2)p$$

and the equation for the end point q is, $$\hat{K}_1 R_1^2/q + \hat{K}_2 q = (\hat{K}_1 + \hat{K}_2)p$$

The parameters leading to the construction of FIGS. 4A and 4B are shown below in relative units.

| FIG. | $\hat{K}_1$ | $\hat{K}_2$ | $R_1$ | p | q | $B_{dipole}$ |
|------|------|------|------|------|------|------|
| 4A | 1 | 0 | 1 | ½ | 3 | 1 |
| 4B | 1 | −0.1 | 1 | ½ | 2 | 0.9 |

We note that the squeezing of the return flux, by a factor of 2 in FIG. 4B, reduced the dipole field by 10% and that the equation of boundary 38 reads:

$$y^2 = 10x/(x+3) - x^2 \quad (9)$$

To realize this system, the current surfaces are approximated by discrete conductors. Superconducting cables are preferred for the construction of the device. Superconductors are generally necessary if the device is to be run in DC mode with currents high enough to cancel the field of a muon storage ring. The device can use conventional conductors if it is to be run with AC, pulsed, or other time-varying currents, but time-varying stray fields will be generated by the conductor array. The relative strength of the multipoles contributing to the field vary as the current changes. However, a number of additional sources can compensate for the field variation. Time-varying currents can also be used with superconductors if it is so desired. With superconductors the relative strengths of the multipoles do not vary with changing current. The superconducting nature of the cables allows for a much higher current density in a smaller area than is possible with conventional cables, thus giving a better approximation to the current surfaces.

Assuming that the superconductors have a relatively small superconducting core embedded in a much larger stabilizing matrix, the continuous surface current must be concentrated in what one could call a distribution of line currents. Designing the layout of conductors involves calculating the optimum location of each line current, the effect of the granularity on the quality of the dipole field, and the amount of stray field adjacent to the septum.

The method consists of constructing an arithmetical series of the complex potential. The real part equals the vector potential as calculated for a given truncation and the imaginary part shows a progression proportional to the current in the wire: $dF = \mu_o I$. The first F in this series would be $F_1 = 0$ for an odd number of turns, and $F_1 = \tfrac{1}{2}\mu_o I$ if the number of turns is even.

Figure 5:
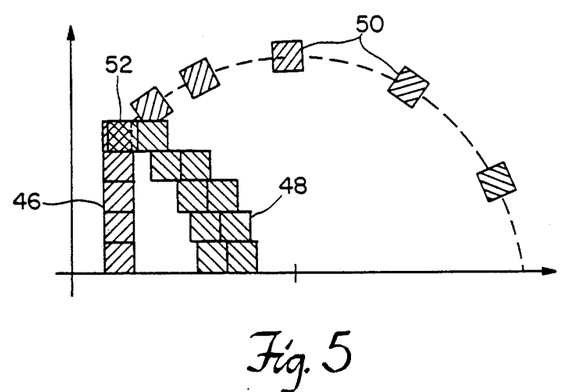
FIG. 5 shows a distribution of discrete conductors simulating current surfaces.

With a known series of $\zeta$, one may solve for z. FIG. 5 shows an example, where for the sake of clarity, only few conductors are depicted. The cosine theta distribution 48 can be made discrete if the conductor density vs y is constant, by virtue of the cosine law. One should preferably select an even number of layers, since the number of conductors on the septum 46 is slightly less than half the number on 48. This ensures a reasonable and uniform packing density on the septum, where the conductors must be evenly spaced according to the relation for $\zeta_1 = -\tfrac{1}{2}\mu_o(\hat{K}_1 + \hat{K}_2)z$.

The equation for $\zeta_2$ applies to boundary 50. As this equation can be solved for z, and the discrete series of $\zeta_2$ is known, the position of the conductors is known.

$$z=(-\zeta_2\pm(\zeta_2{}^2-\mu_o{}^2\hat{K}_1\hat{K}_2R_1{}^2)^{\frac{1}{2}})/(\mu_o\hat{K}_2) \quad (10)$$

The second root in the solution is due to the analytical continuation of $F_2$ and $A_2$.

Figure 6:
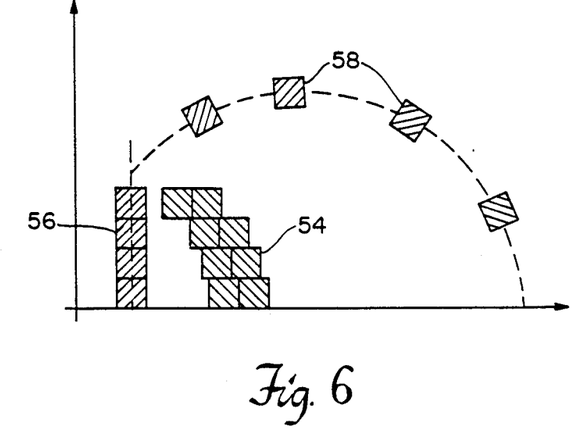
FIG. 6 shows a distribution of discrete conductors with interfering conductors removed.

FIG. 5 shows that near the intersect of boundary 46, 48, and 50 physical interference of some conductors may occur. These conductors must be deleted in a pair wise fashion as shown in FIG. 6. In the present example, the cosine theta distribution 54 lost two turns and the septum 56 and closing boundary 58 each one turn. In this case, an enhancement of the stray field and of the harmonic content of the dipole field may occur. Small adjustments of the position of adjacent conductors will reduce either enhancement.

The potential field and Lorentz forces of a multiwire system can be computed as follows. The potential of a single current in a wire positioned in the origin may be written as:

$$A = -(\mu_o I/2\pi) \ln|z| \quad (11)$$

in which $z = x + iy$, I is the current, and A is the component perpendicular to x and y. It can be shown that $\ln z = \text{Re}[\ln(z)]$, the real part of $\ln(z)$. If the wire is not in the origin, but in $\bar{z}$, $\text{Re}[\ln(z-\bar{z})]$ is used and can be developed in a power series. $\text{Re}[\ln(\bar{z}31\ z\ )]$ will be used when the current sources lie outside the domain in which the power series must converge. This is usually the case, and $\ln(\bar{z} - z)$ can be written as follows:

$$\ln(\bar{z} - z) = \ln(\bar{z}(1 - z/\bar{z})) = \ln(\bar{z}) + \ln(1 - z/\bar{z})$$

The term $\ln(\bar{z})$ can be ignored because it is a constant, and will drop out when the field components are found by differentiating A. A power series is now written as:

$$\ln(1 - z/\bar{z}) = -\sum_{N=1}^{N=\infty} (1/N)(z/\bar{z})^N \quad (12)$$

Each term represents the complete multipole contribution of order N, normal and skewed, of the wire in question. The format of A will be as follows:

$$A(x,y) = \text{Re} \sum_{N=1}^{N=\infty} (A_N + iB_N)(z/R)^N,$$

from which it can be shown that:

$$A_N = -(\mu_o I/2\pi)(R^N/N)\,\text{Re}(\bar{z}^{-N}) \quad (13a)$$

$$B_N = -(\mu_o I/2\pi)(R^N/N)\,\text{Im}(\bar{z}^{-N}) \quad (13b)$$

z is usually given in cartesian coordinates: $\bar{z} = \bar{x} + i\bar{y}$, so that:

$$\text{Re}(\bar{z}^{-N}) = (\bar{x}^2 + \bar{y}^2)^{-N/2}\cos(N\tan^{-1}(\bar{y}/\bar{x}))$$

$$\text{Im}(\bar{z}^{-N}) = (\bar{x}^2 + \bar{y}^2)^{-N/2}\sin(N\tan^{-1}(\bar{y}/\bar{x}))$$

To get the contributions of all wires, the bar on x and y is dropped and the following summations are formed using the variables $I_j$, $x_j$, and $y_j$.

$$A_N = \sum_j A_{j,N}$$
$$= -\sum_j (\mu_o I_j/2\pi)(R^N/N)(x_j{}^2 + y_j{}^2)^{-N/2}\cos(N\tan^{-1}(y_j/x_j))$$

$$B_N = \sum_j B_{j,N}$$
$$= -\sum_j (\mu_o I_j/2\pi)(R^N/N)(x_j{}^2 + y_j{}^2)^{-N/2}\sin(N\tan^{-1}(y_j/x_j))$$

In order that the expansion converges. R should be smaller than the modulus of any $z_j$, but R is often chosen near the boundary of the fiducial volume or on the radius on which one measures the field. Note that the currents may be chosen freely, but being that there is usually just one current source, the wires are likely to be connected in series. Thus in half of them the current is positive and in the other half the current is negative.

Finally the magnetic field components are found from B = curl A, which yields:

$$B_x - iB_y = i\sum_N (N/R)(A_N + iB_N)(z/R)^{N-1} \quad (14)$$

The coefficients $A_N$ and $B_N$ are all one needs to know about the Nth harmonic of the magnetic field. From the characteristics of a given wire: $I_j$, $x_j$ and $y_j$, the contribution to $A_N$ respectively $B_N$ is readily obtained. In a system symmetric with respect to the x-axis, $B_N = 0$, so there are no skewed multipoles.

The components of the Lorentz force per unit length, $F^{jk}$, on wire k due to the field produced by wire j, may be shown:

$$F_x{}^{jk} = (\mu_o I_j I_k/2\pi)(x_j - x_k)/r^2 \quad (15a)$$

$$F_y{}^{jk} = (\mu_o I_j I_k/2\pi)(y_j - y_k)/r^2 \quad (15b)$$

where $r^2 = (x_j - x_k)^2 + (y_j - y_k)^2$
Thus, $$F_x{}^k = \sum_j F_x{}^{jk}, j \neq k \text{ and } F_y{}^k = \sum_j F_y{}^{jk}, j \neq k$$

If the wire system is immersed in an external magnetic field, the forces on the wires contain the additional terms:

$$F_x{}^k = -I_k B_y{}^{ext} \text{ and } F_y{}^k = I_k B_x{}^{ext}$$

where the components of $B^{ext}$ are evaluated at the location $x_k$, $y_k$.

The conductors following the radius 48 of FIG. 5 are arranged in a staircase fashion to approximate the cosine distribution.

Since each conductor will carry the same amount of current the arrangement of the steps in the staircase can be found by integrating the cos $\theta$ function over each step.

$$I = \int_{\theta_1}^{\theta_2} \cos\theta\, d\theta = \sin\theta \,\Big|_{\theta_1}^{\theta_2} \quad (16)$$

or, $$I = \sin\theta_2 - \sin\theta_1$$

Since vertical displacement $y = R_1 \sin \theta$, I is proportional to some $\Delta y = y_2 - y_1$. This $\Delta y$ can be used to find the appropriate positions of the conductors in the staircase approximation.

The outer boundary 50 will have a current distribution concentrated on a set of conductors placed at points between which an equal amount of current theoretically passes throughout the ideal axial current conducting surface. This separation is chosen so as not to impair the quality of the dipole field or the field free region.

Figure 7:
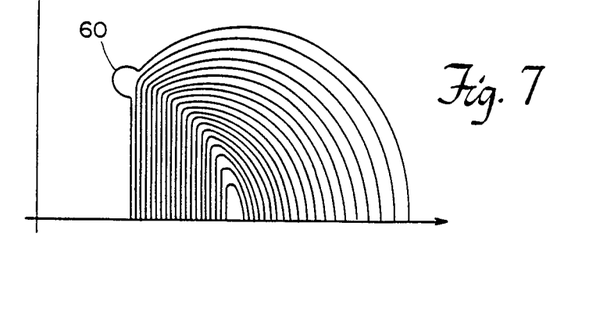
FIG. 7 shows the magnetic field lines of a truncated double cosine magnet as approximated by a distribution of discrete conductors.

An example of the field line disturbances due to conductor deletion is shown in FIG. 7. The bulge 60 in the outer portion of the field is due to the deletion of conductors at the point of physical interference.

In one application of the invention, the desired field of 1.47 Tesla in the uniform field region establishes the magnitude of $K_1$. The field cancellation effect of the outer boundary defines $K_2$ which is given by equation (4).

$$\hat{k}_1 R_1^2 = -\hat{k}_2 R_2^2 \quad (4)$$

The surface current density along the truncated straight boundary is constant. A current density of 800 amp/mm-unit length of inflector provides a 1.0 Tesla field in the uniform region. A small tradeoff occurs when the field outside of $R_2$ due to $R_1$ is cancelled because the overall current must be slightly increased. The vertical boundary above median plane is 46 mm high and can reasonably be occupied by 8.5 conductors which are 5 mm high and 3 mm wide. This implies 20 conductors located in pairs on the circle segment R1 and 11.5 conductors on the outer boundary. Thus, in total this particular design would have 40 complete turns. However, one peripheral conductor is close enough to one from the distribution on R1 that effective cancellation occurs. Hence this particular design winds up with 38 complete turns with applied current of 6500 Amperes to obtain 1.5 Tesla of useful magnetic field. The current density would be 500 A/mm$^2$.

Figure 8:
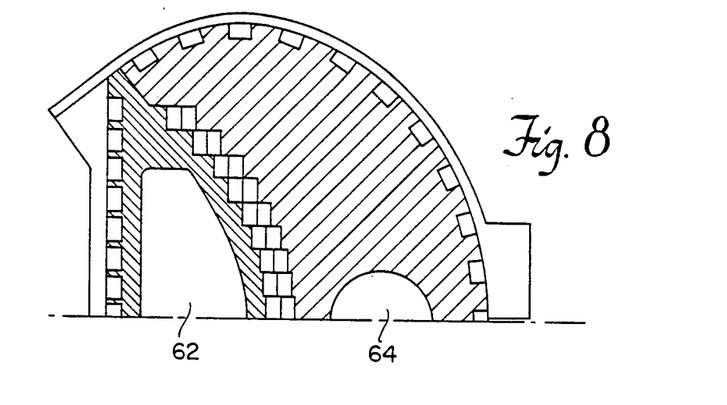
FIG. 8 shows the physical structure of the truncated double cosine magnet.

FIG. 8 shows a typical arrangement of conductors in a physical implementation of the system. A magnetic channel 62 through which the particles travel is made as large as possible, leaving enough material to support the conductors in view of the Lorentz forces incurred with such large currents. A circular hole 64 serves as a cooling conduit when superconductors are used.

Figure 9:
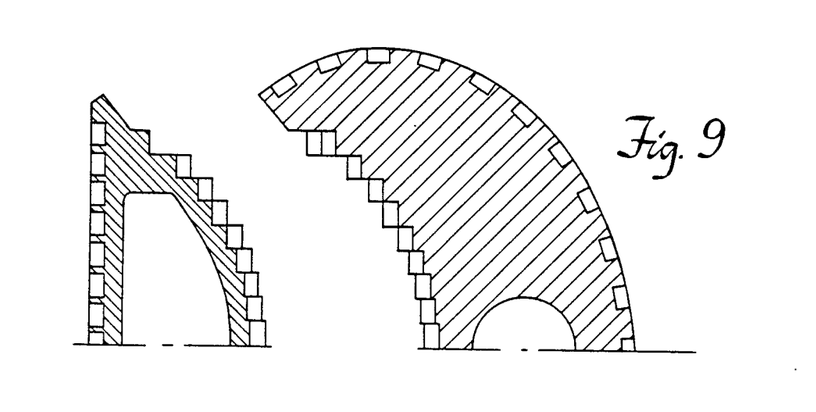
FIG. 9 shows two separately manufactured portions of the magnet.

One manufacturing method is to fabricate the device in two parts. FIG. 9 shows two sections of the channel magnet which may be formed separately. Each part contains grooves in which conductors are wound before the sections are fastened together with clamps or other securing means.

Figure 10:
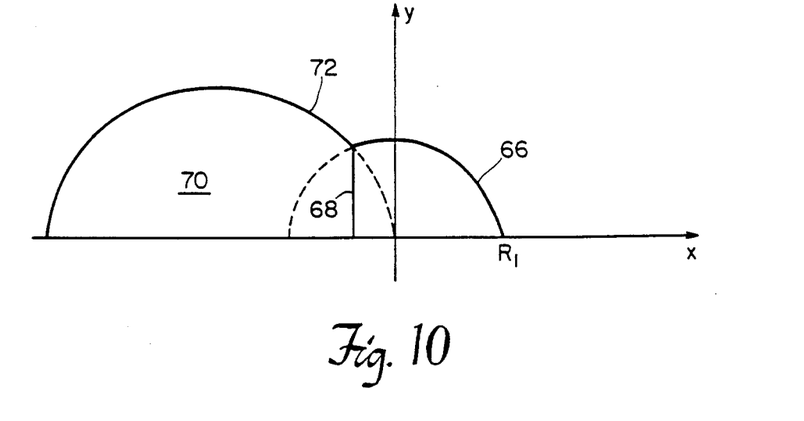
FIG. 10 shows an alternate form of the truncated cosine theory.

Another form of the truncated cosine field generator is shown in FIG. 10. The cosine distribution 66 extends to the left of the center plane to the truncation 68. The dipole field exists within the boundaries of the cosine distribution 66 and the septum truncation 68. A field free region 70 to the inside of the chosen flux line 72 may be created by proper choice of current along the surface 72,68, and the stray fields exist to the outside of the boundaries 66,72.

Figure 11:
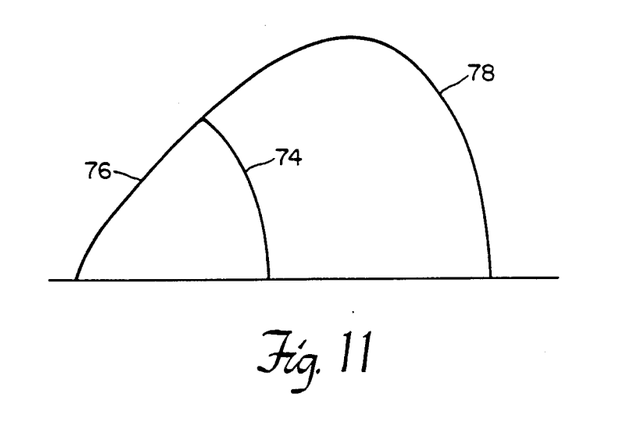
FIG. 11 shows a portion of a cylindrical quadrupole cosine distribution and a resulting magnetic field line.
Figure 12:
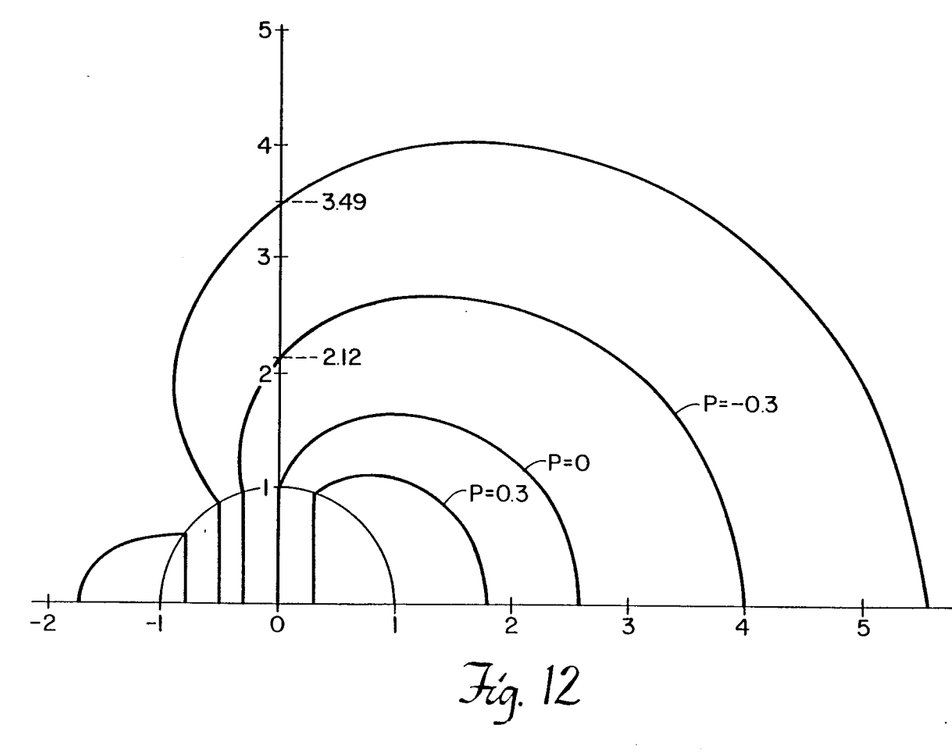
FIG. 12 shows uniform distribution added to a cosine distribution on a cylindrical segment.

The truncated cosine method may also be applied to desired fields other than dipoles. A quadrupole field generated by a cosine theta distribution is shown in FIG. 11. A $\cos(2\theta)$ distribution resides along the line 74 and, along with the truncation 76, encloses the quadrupole field region. A current density placed along flux line 78 can be found which causes the area outside the region enclosed by 78 and 76 to be virtually field free. Depending on one's reference point, the quadrupole field of FIG. 11 can be seen as a combination of quadrupole and dipole fields. Any combination of dipole, quadrupole, or harmonic fields thereof may be generated using the truncated double cosine method. In one variation, a flat distribution is added to the cosine distribution on R1 of FIG. 3A. This is the equivalent of adding a DC component in a Fourier expansion, or adding the current density distribution of Equation (3) where $N = 0$. FIG. 12 shows a simple cosine distribution of magnitude $K_1 - 1$ added to a flat distribution of $K_0 = -0.2$. As shown, the DC term does not add a field inside R1, but modifies considerably the stray field pattern. In general, a source can be determined for any desired field within a limited region. Potential theory allows to consider any desired magnetic, field within a limited region as a superposition of an infinite, but converging, series of multipoles. Each component can be generated by a $\cos(N\theta)$ current distribution on a circular cylinder of radius R completely enclosing said limited region. Once a source has been determined, a flux line can be found on which a current density can be placed such that a field free region is formed outside the chosen line of flux.

The present invention is particularly useful in the transport of particle beams. Long channels may have some curvature to accommodate the bending of the particle beams and this possibility is included in the invention. For example, the truncated cosine technique can be applied to the design of a magnetic ring such as shown in FIG. 1. The quadrupole design of FIG. 11 would be particularly effective in that application.

What is claimed:

1. A magnetic field generating device comprising:
   a first axial current conducting structure which supports a current density approximating a cosine distribution about a truncated cylinder; and
   a second axial current conducting structure which supports a current in an axial direction opposite to the direction of current carried by the first structure, the second structure supporting a current density which causes a near zero field due to the first and second conductors to the side of the second conductor away from the first conductor.

2. A device as claimed in claim 1 wherein said axial current conducting structures generate a magnetic field comprising a combination of multipole fields.

3. A device as claimed in claim 1 wherein the currents supported by said axial current conducting structures are time-varying currents.

4. A device as claimed in claim 1 wherein said device is a charged particle guide.

5. A device as claimed in claim 4 wherein said device has curvature along the trajectory of guided particles.

6. A device as claimed in claim 1 wherein the second structure surrounds the first structure.

7. A device as claimed in claim 1, wherein the first axial current conducting structure supports a uniform distribution of current density in addition to the current density approximating a cosine distribution.

8. A device as claimed in claim 1 wherein said current conducting structures comprise a distribution of discrete conductors approximating said current densities.

9. A device as claimed in claim 8 wherein said discrete conductors are of a superconducting nature.

10. A device as claimed in claim 1 formed substantially of nonferrous material.

11. A magnetic field generating device comprising:
a first axial current conducting structure which supports a current density approximating a cosine distribution about a truncated cylinder; and
a second axial current conducting structure which supports a current in an axial direction opposite to the direction of current carried by the first structure, the second structure being shaped to approximate a closed flux surface of constant magnetic potential formed by at least one fully cylindrical concentric conductor, each supporting a cosine distribution of current, and the second structure supporting a current density which causes a near zero field due to the first and second conductors to the side of the second conductors away from the first conductor.

12. A device as claimed in claim 11 wherein said axial current conducting structures generate a magnetic field comprising of a combination of multipole fields.

13. A device as claimed in claim 11 wherein the currents supported by said axial current conducting structures are time-varying currents.

14. A device as claimed in claim 11 wherein said device is a charged particle guide.

15. A device as claimed in claim 14 wherein said device has curvature along the trajectory of guided particles.

16. A device as claimed in claim 11 wherein the second structure surrounds the first structure.

17. A device as claimed in claim 11 wherein the first axial current conducting structure supports a uniform distribution of current density in addition to the current density approximating a cosine distribution.

18. A device as claimed in claim 11 wherein said current conducting structures comprise a distribution of discrete conductors approximating said current densities.

19. A device as claimed in claim 18 wherein said discrete conductors are of a superconducting nature.

20. A device as claimed in claim 11 formed substantially of nonferrous material.

21. A magnetic channel device which locally cancels the magnetic field generated for a particle storage ring, allowing the injection of charged particles into said storage ring, the device comprising a first axial current conducting structure and a second axial current conducting structure generating a combined magnetic field equal in magnitude and opposite in polarity to said magnetic field generated for said storage ring in the region of said magnetic channel device where the magnetic channel is under the influence of said magnetic field generated for said storage ring, wherein said first axial current conducting structure supports a current density approximating a cosine distribution about a truncated cylinder, and said second axial current conducting structure supports a current in an axial direction opposite to the direction of current carried by the first structure, the second structure being shaped to approximate a closed flux surface of constant magnetic potential formed by at least one fully cylindrical concentric conductor, each supporting a cosine distribution of current, said second structure surrounding said first structure and said magnetic channel, and said second structure supporting a current density which causes a near zero field outside the area surrounded by said second structure.

22. A device as claimed in claim 21 wherein said current conducting structures comprise a distribution of discrete conductors approximating said current density.

23. A device as claimed in claim 22 wherein said discrete conductors are of a superconducting nature.

24. A device as claimed in claim 21 wherein a uniform current density is added to the current density supported by the first axial current conducting structure.

25. A method of manufacturing a magnetic field generating device which creates a magnetic field in a first region within a first boundary and a near zero stray magnetic field in a region outside a second boundary comprising:
determining a source of the predetermined field within the first boundary;
determining a flux surface of constant magnetic potential created by said source between the first boundary and the second boundary;
determining a current density on said flux surface which, with the portion of said source located on the side of said flux surface opposite to the second region, results in zero stray magnetic field on the side of said flux surface on which the second region is located; and
constructing a field generating device comprising said portion of said source and a structure supporting the determined current density.

26. A method as claimed in claim 25 wherein said structure supporting the determined current density is manufactured as separate structures to be fitted together, each separate structure supporting a different portion of said current density.

* * * * *

UNITED STATES PATENT AND TRADEMARK OFFICE
CERTIFICATE OF CORRECTION

PATENT NO. : 4,939,493

DATED : July 3, 1990

INVENTOR(S) : Frank Krienen

It is certified that error appears in the above-identified patent and that said Letters Patent is hereby corrected as shown below:

On the cover page, in the left-hand column, line 2 delete as the Inventor's name "Krienin", and insert in its place ---Krienen---.

On the cover page, in the left-hand column, line 4, delete as the Inventor's name "Frank Krienin", and insert in its place ---Frank Krienen---.

In column 7, line 28 delete "$Re[\ln(\bar{z}31\ z)]$" and insert in its place ---$Re[\ln(\bar{z}-z)]$---.

Signed and Sealed this

Twenty-fifth Day of February, 1992

Attest:

HARRY F. MANBECK, JR.

*Attesting Officer*      *Commissioner of Patents and Trademarks*